(12) United States Patent
Hwangbo

(10) Patent No.: US 11,778,738 B2
(45) Date of Patent: Oct. 3, 2023

(54) PRINTED CIRCUIT BOARD ASSEMBLY

(71) Applicant: SAMSUNG ELECTRONICS CO., LTD., Suwon-si (KR)

(72) Inventor: Hoon Hwangbo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 17/277,569

(22) PCT Filed: Aug. 20, 2019

(86) PCT No.: PCT/KR2019/010536
§ 371 (c)(1),
(2) Date: Mar. 18, 2021

(87) PCT Pub. No.: WO2020/060040
PCT Pub. Date: Mar. 26, 2020

(65) Prior Publication Data
US 2021/0289622 A1    Sep. 16, 2021

(30) Foreign Application Priority Data

Sep. 21, 2018 (KR) .......................... 10-2018-0113601

(51) Int. Cl.
*H05K 1/02* (2006.01)
*H05K 1/14* (2006.01)

(52) U.S. Cl.
CPC ........... *H05K 1/0296* (2013.01); *H05K 1/142* (2013.01)

(58) Field of Classification Search
CPC ......... H05K 1/02; H05K 1/142; H05K 1/0296

USPC ........................................................ 174/261
See application file for complete search history.

(56) References Cited

U.S. PATENT DOCUMENTS

| | | | |
|---|---|---|---|
| 8,866,563 B1 | 10/2014 | Ben Artsi | |
| 9,532,441 B2 | 12/2016 | Lee et al. | |
| 9,711,446 B2 | 7/2017 | Nakamura et al. | |
| 2001/0042636 A1 | 11/2001 | Biron | |
| 2015/0230330 A1* | 8/2015 | Lee ........................ | H05K 1/025 29/830 |

(Continued)

FOREIGN PATENT DOCUMENTS

| | | |
|---|---|---|
| JP | 4-212440 A | 8/1992 |
| JP | 2001-15880 A | 1/2001 |
| KR | 10-2015-0095092 A | 8/2015 |

(Continued)

OTHER PUBLICATIONS

International Search Report dated Dec. 18, 2019 issued by the International Searching Authority in counterpart International Application No. PCT/KR2019/010536 (PCT/ISA/210).

(Continued)

*Primary Examiner* — Tremesha S Willis
(74) *Attorney, Agent, or Firm* — Sughrue Mion, PLLC

(57) ABSTRACT

A printed circuit board assembly includes a main printed circuit board including a first main signal line and a first dielectric having a first permittivity; a sub printed circuit board including a first sub signal line and a second dielectric having a second permittivity smaller than the first permittivity; and a first connection block configured to connect the first main signal line of the main printed circuit board and the first sub signal line of the sub printed circuit board.

16 Claims, 11 Drawing Sheets

(56) References Cited

U.S. PATENT DOCUMENTS

2017/0154841 A1* 6/2017 Nakamura ........ H01L 23/49822

FOREIGN PATENT DOCUMENTS

| KR | 10-2017-0064482 A | 6/2017 |
| KR | 20-2017-0003366 U | 9/2017 |

OTHER PUBLICATIONS

Office Action, Notice of Preliminary Rejection, dated Dec. 12, 2022 issued by the Korean Patent Office, Application No. 10-2018-0113601.

* cited by examiner

PRINTED CIRCUIT BOARD ASSEMBLY

TECHNICAL FIELD

The present disclosure relates to a printed circuit board assembly, and more particularly, to a printed circuit board assembly for connecting a main printed circuit board on which a main circuit is formed and a sub printed circuit board on which a sub circuit is formed.

BACKGROUND ART

Generally, printed circuit boards mechanically support electronic components, and electrically connect the electronic components (e.g., integrated circuit elements, resistors, capacitors, inductors, switches, etc.) to each other using conductive lines, pads, and plates. The conductive lines, pads, and plates are formed by being etched from a metal sheet (e.g., a copper sheet) on a nonconductive substrate. In addition, the electronic components are soldered onto a printed circuit board.

Printed circuit boards are distinguished into single-sided printed circuit boards, double-sided printed circuit boards or multi-layer printed circuit boards depending on the number of conductive layers including conductive lines, conductive pads and conductive plates. The multilayer printed circuit boards are variously distinguished into four-layer printed circuit boards, six-layer printed circuit boards, eight-layer printed circuit boards and the like.

The conductive lines, the conductive pads, and the conductive plates formed on the printed circuit board may be distinguished into signal transmitting members to which signals are transmitted, power supply members to which power is supplied, and ground members connected to the ground, depending on their functions.

A signal may be transmitted from a signal transmission component to the signal reception component by a signal transmitting member. The transmission of a signal produces a current flow. That is, when a signal is transmitted from the signal transmission component to the signal reception component through the signal transmitting member, a current flows from the signal transmission component to the signal reception component through the signal transmitting member.

When the printed circuit boards are connected to each other, there are a method of using a connector and a method of using a cable. Compared to the case of connecting the printed circuit board and the printed circuit board using the connector, a cable cost may be incurred when the printed circuit board and the printed circuit board are connected using the cable.

Accordingly, a method of connecting the printed circuit board and the printed circuit board using the connector is generally used. However, in the case of using the connector, there is a problem in that an electronic element of the printed circuit board is unstable in high-frequency characteristics due to an impedance mismatch between an inductance component of the connector and the printed circuit board. Accordingly, a connection between the printed circuit boards using the connectors may be difficult to use for high-speed communication.

DISCLOSURE

Technical Problem

An aspect of the present disclosure is to provide a printed circuit board assembly capable of high-speed communication.

Another aspect of the present disclosure is to provide a printed circuit board assembly capable of lowering a unit cost by partially bonding a sub printed circuit board capable of high-speed communication to a main printed circuit board.

An aspect of the present disclosure is to provide a printed circuit board assembly that solves a limitation in which impedance mismatching occurs when different printed circuit boards are bonded and a limitation in which inductance is increased.

Technical Solution

An aspect of the disclosure provides a printed circuit board assembly including: a main printed circuit board including a first main signal line and a first dielectric having a first permittivity; a sub printed circuit board including a first sub signal line and a second dielectric having a second permittivity smaller than the first permittivity; and a first connection block configured to connect the first main signal line of the main printed circuit board and the first sub signal line of the sub printed circuit board.

The first connection block may further include a first connection portion configured to electrically connect the first main signal line and the first sub signal line.

The main printed circuit board may further include a main power line and a main ground line. The sub printed circuit board may further include a sub power line and a sub ground line. The printed circuit board assembly may further include a second connection block configured to connect the main power line and the sub power line, and a third connection block configured to connect the main ground line and the sub ground line.

The second connection block may further include a second connection portion configured to electrically connect the main power line and the sub power line. The third connection block may further include a third connection portion configured to electrically connect the main ground line and the sub ground line.

The first connection block, the second connection block, and the third connection block may include a printed circuit board.

The first connection block, the second connection block, and the third connection block may be mounted on the surfaces of the main printed circuit board and the sub printed circuit board by surface mount technology (SMT).

A width of the first main signal line is narrower than a width of the first sub signal line.

A communication speed of the first sub signal line is faster than a communication speed of the first main signal line.

The first connection block may include at least one pin fixed to the main printed circuit board and at least one pin fixed to the sub printed circuit board. The main printed circuit board may include at least one groove to which the at least one pin of the first connection block is fixed. The sub printed circuit board may include at least one groove to which the at least one pin of the first connection block is fixed.

The at least one pin of the first connection block is physically fixed and coupled to the groove of the main printed circuit board and the groove of the sub printed circuit board, respectively.

Another aspect of the disclosure provides a printed circuit board assembly including: a main printed circuit board having a first main signal line and a first communication speed; a sub printed circuit board having a first sub signal line and a second communication speed faster than the first communication speed; and a first connection block configured to connect the first main signal line of the main printed circuit board and the first sub signal line of the sub printed circuit board.

The first connection block may further include a first connection portion configured to electrically connect the first main signal line and the first sub signal line.

The main printed circuit board may further include a main power line and a main ground line. The sub printed circuit board may further include a sub power line and a sub ground line. The printed circuit board assembly may further include a second connection block configured to connect the main power line and the sub power line, and a third connection block configured to connect the main ground line and the sub ground line.

The second connection block may further include a second connection portion configured to electrically connect the main power line and the sub power line. The third connection block may further include a third connection portion configured to electrically connect the main ground line and the sub ground line.

The first connection block, the second connection block, and the third connection block may include a printed circuit board.

The first connection block, the second connection block, and the third connection block may be mounted on the surfaces of the main printed circuit board and the sub printed circuit board by surface mount technology (SMT).

A width of the first main signal line is narrower than a width of the first sub signal line.

The main printed circuit board may further include a first dielectric having a first dielectric constant. The sub-printed circuit board may further include a second dielectric having a second dielectric constant lower than the first dielectric constant.

The first connection block may include at least one pin fixed to the main printed circuit board and at least one pin fixed to the sub printed circuit board. The main printed circuit board may include at least one groove to which the at least one pin of the first connection block is fixed. The sub printed circuit board may include at least one groove to which the at least one pin of the first connection block is fixed.

The at least one pin of the first connection block is physically fixed and coupled to the groove of the main printed circuit board and the groove of the sub printed circuit board, respectively.

Advantageous Effects

According to an aspect of the disclosure, it is possible to provide a printed circuit board assembly capable of lowering a unit cost by partially bonding a sub printed circuit board capable of high-speed communication to a main printed circuit board. In addition, it is possible to solve a limitation in which impedance mismatching occurs when different printed circuit boards are bonded and a limitation in which inductance increases.

MODES OF THE INVENTION

Figure 1:
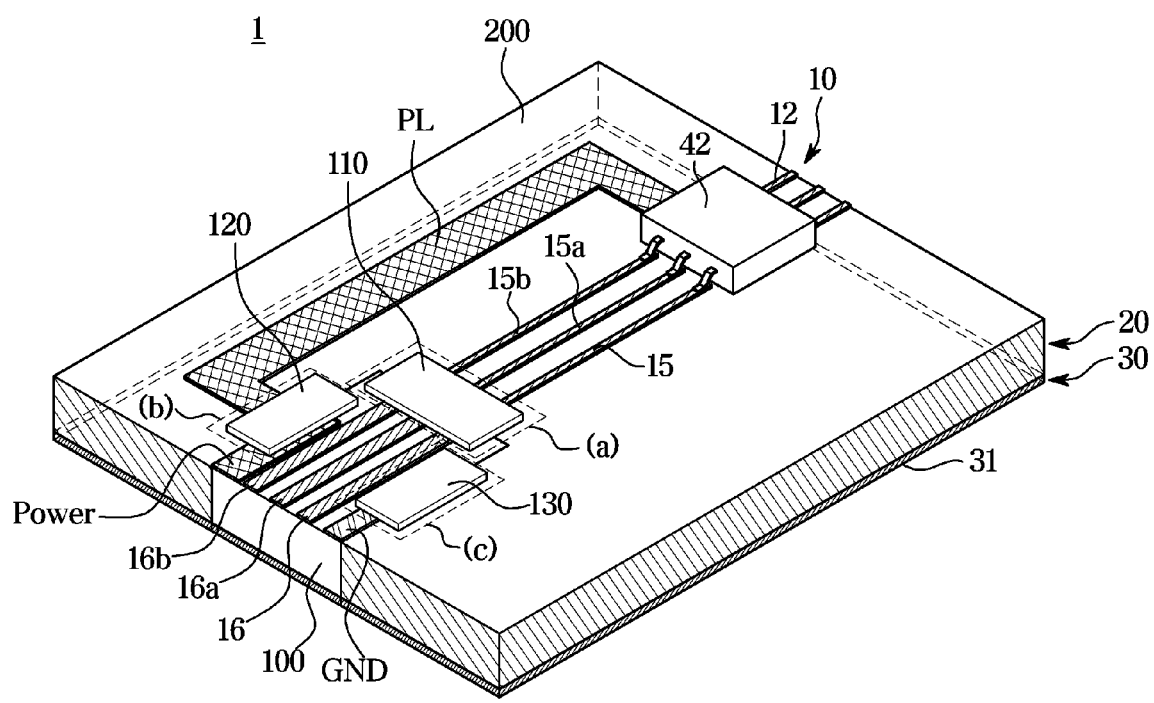
FIG. 1 is a view illustrating an example of a printed circuit board assembly including a main printed circuit board and a sub printed circuit board according to an embodiment.

Like reference numerals refer to like elements throughout the specification. Not all elements of the embodiments of the disclosure will be described, and the description of what are commonly known in the art or what overlap each other in the exemplary embodiments will be omitted. The terms as used throughout the specification, such as "~ part," "~ module," "~ member," "~ block," etc., may be implemented in software and/or hardware, and a plurality of "~ parts," "~ modules," "~ members," or "~ blocks" may be implemented in a single element, or a single "~ part," "~ module," "~ member," or "~ block" may include a plurality of elements.

It will be further understood that the term "connect" and its derivatives refer both to direct and indirect connection, and the indirect connection includes a connection over a wireless communication network.

The terms "include (or including)" and "comprise (or comprising)" are inclusive or open-ended and do not exclude additional, unrecited elements or method steps, unless otherwise mentioned. It will be further understood that the term "member" and its derivatives refer both to when a member is in contact with another member and when another member exists between the two members.

Further, when it is stated that a layer is "on" another layer or substrate, the layer may be directly on another layer or substrate or a third layer may be disposed therebetween.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

It is to be understood that the singular forms "a," "an," and "the" include plural references unless the context clearly dictates otherwise.

Reference numerals used for method steps are merely used for convenience of explanation, but not to limit an order of the steps. Thus, unless the context clearly dictates otherwise, the written order may be practiced otherwise.

Hereinafter, an operation principle and embodiments of the disclosure will be described with reference to accompanying drawings.

Figure 2:
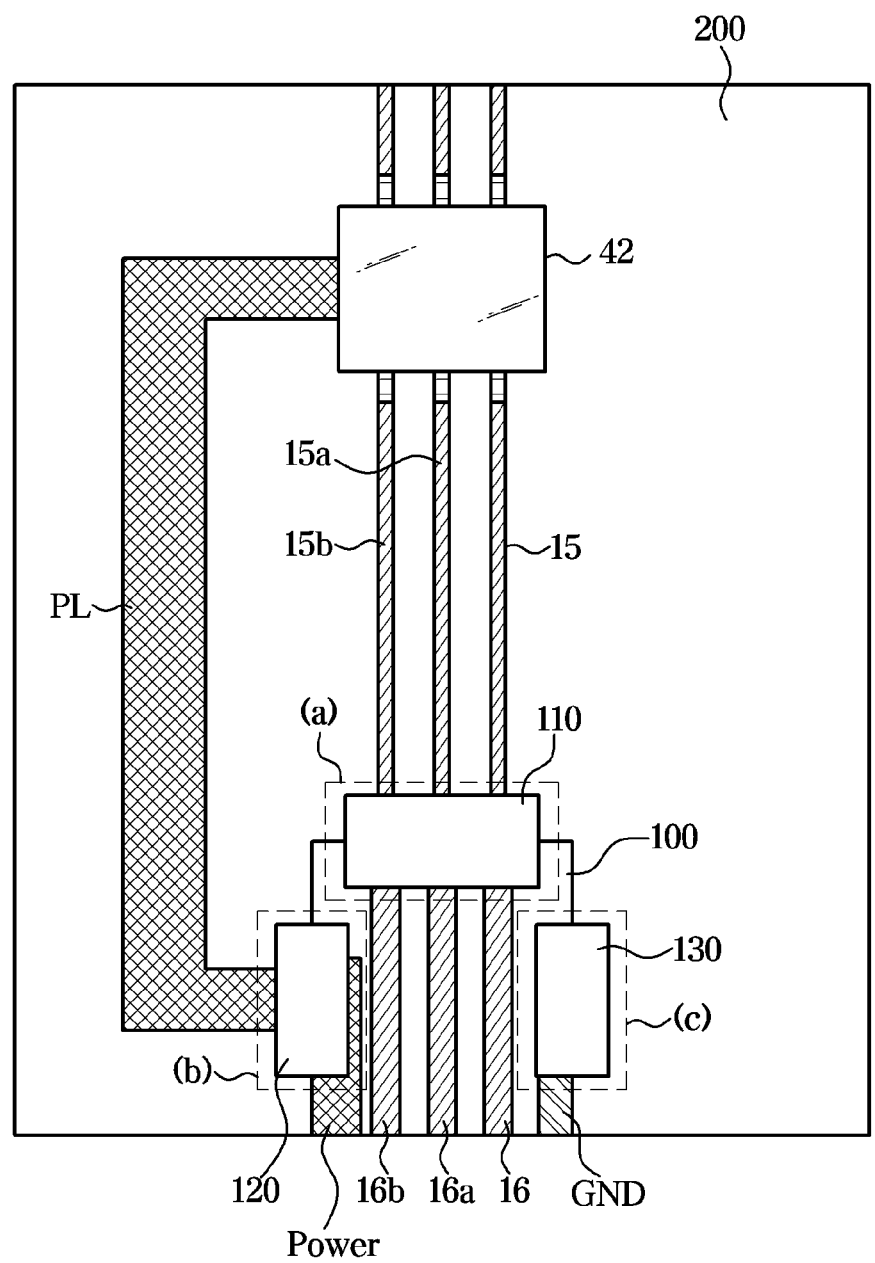
FIG. 2 is a view illustrating an upper surface of a printed circuit board assembly according to an embodiment.
Figure 3:
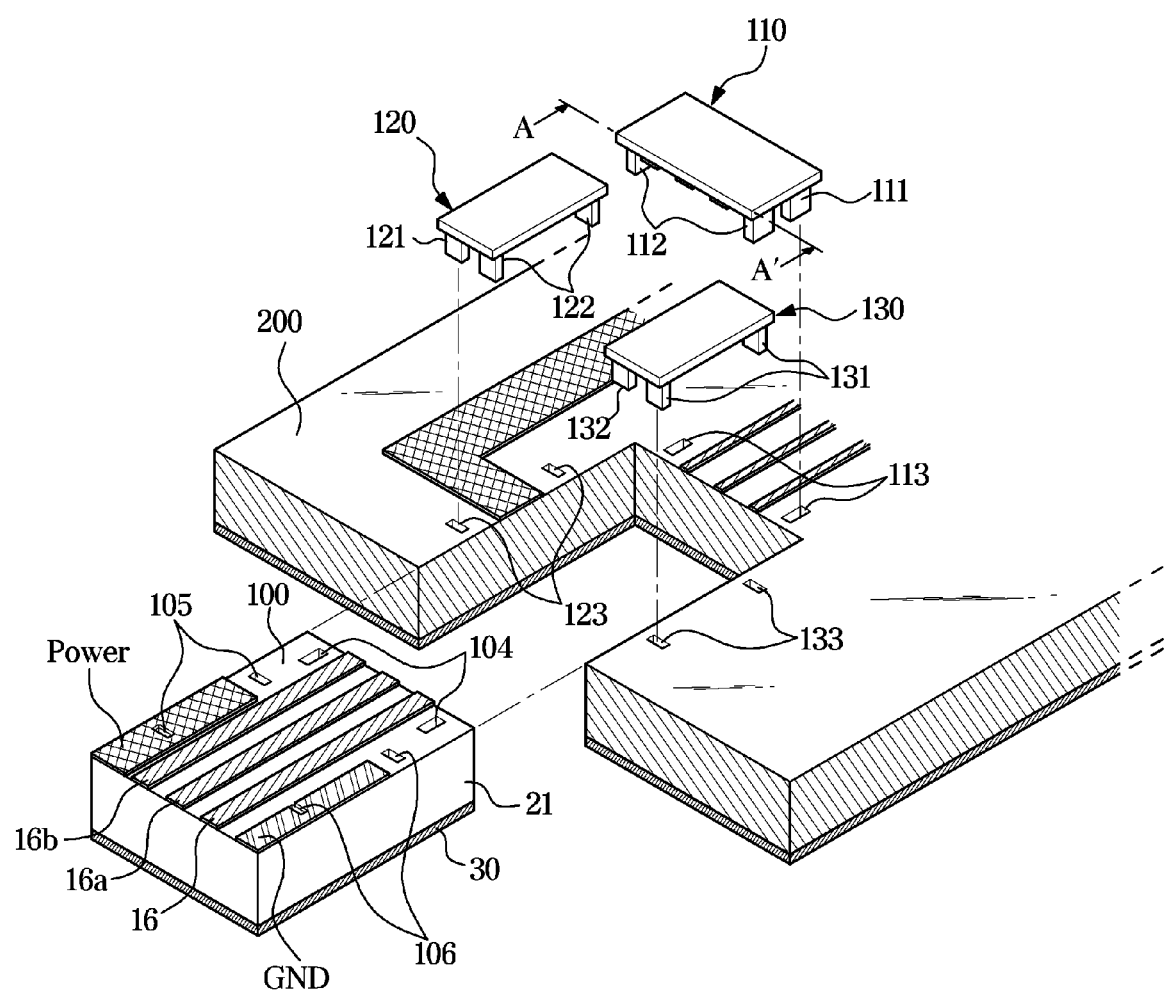
FIG. 3 is a perspective view illustrating a sub printed circuit board and first to third connection blocks according to an embodiment.

FIG. 1 is a view illustrating an example of a printed circuit board assembly including a main printed circuit board and a sub printed circuit board according to an embodiment. FIG. 2 is a view illustrating an upper surface of a printed circuit board assembly according to an embodiment. FIG. 3 is a perspective view illustrating a sub printed circuit board and first to third connection blocks according to an embodiment.

FIG. 1 illustrates an example of a printed circuit board assembly according to an embodiment.

Referring to FIGS. 1 to 3, a printed circuit board assembly 1 may include at least two conductor layers 10 and 30 and at least one dielectric layer 20 or 21.

As illustrated in FIG. 1, the printed circuit board assembly 1 may include a first conductor layer 10 and a second conductor layer 30 provided in parallel with each other, and the dielectric layers 20 and 21 provided between the first conductor layer 10 and the second conductor layer 30. FIG. 1 illustrates a double-sided printed circuit board including the first and second conductor layers 10 and 30 and the dielectric layer 20, but the present disclosure is not limited thereto. For example, the printed circuit board assembly 1 may be a four-layer printed circuit board assembly comprising four conductor layers and two dielectric layers, or a six-layer printed circuit board assembly comprising six conductor layers and four dielectric layers.

The first conductor layer 10 may include various conductive patterns such as lines, pads, plates, etc., made of a conductive material (e.g., metal, carbon nanotube, or the like). These conductive patterns may include signal transmission patterns (e.g., lines, pads, plates, etc.), power supply patterns, and ground patterns depending on their functions.

The signal transmission pattern may refer to lines, pads, plates, and the like that transmit electrical signals between elements.

The power supply pattern may refer to lines, pads, plates, and the like for supplying electric power to the elements from a power source (e.g., a battery or the like), and a predetermined voltage may be applied to the power supply pattern.

The ground pattern may refer to lines, pads, plates, and the like that output a reference potential with respect to a voltage applied by the power supply pattern.

In addition, various electronic components such as resistors, capacitors, inductors, switches, and integrated circuit elements may be mounted on the first conductor layer 10. The signal transmission pattern, the power supply pattern, and the ground pattern described above are provided between the electronic components, power is supplied to the electronic components through the power supply pattern and the ground pattern, and the electronic components may exchange signals with each other through the signal transmission pattern.

These various conductive patterns and various electronic components may form an electric circuit that receive signals, information, data, etc. from other circuits, processes the received signals, information, data, etc., and outputs the processed signals, information, data, etc.

For example, a first electronic element 41 may be mounted on the first conductor layer 10. The first electronic element 41 may be various elements such as switches, resistors, capacitors, and integrated circuit elements, respectively, and may process the input signals and output the processed signals.

The first conductor layer 10 may include a line 14 that supplies power to the first electronic element 41 or provides grounding to first electronic element 41.

As illustrated in FIGS. 1 and 2, the printed circuit board assembly 1 may include a main printed circuit board 200 on which the first electronic element 41 is mounted and a sub printed circuit board 100 which is bonded to the main printed circuit board 200 to form the printed circuit board assembly 1.

Like the main printed circuit board 200, the sub printed circuit board 100 may also include the first conductor layer 10, the second conductor layer 30, and a dielectric layer 21 provided between the first conductor layer 10 and the second conductor layer 30.

In this case, the first dielectric layer 20 of the main printed circuit board 200 and the second dielectric layer 21 of the sub printed circuit board 100 may have different permittivity. A first permittivity of the first dielectric layer 20 of the main printed circuit board 200 may be greater than a second permittivity of the second dielectric layer 21 of the sub printed circuit board 100.

The main printed circuit board 200 may further include an upper surface signal line 15 connected to a mounted element (e.g., the first electronic element).

In addition, the upper surface signal line 15 may further include upper surface signal lines 15a and 15b different from the upper surface signal line 15 of the main printed circuit board 200, and may transmit signals between elements mounted on the main printed circuit board 200 as well as other upper surface signal lines 15a and 15b.

In addition, the sub printed circuit board 100 may also include an upper surface signal line 16. The upper surface signal line 16 included in the sub printed circuit board 100 may further include other upper surface signal lines 16a and 16b, and may transmit signals between elements mounted on the sub printed circuit board 100 as well as other upper surface signal lines 16a and 16b.

In this case, widths of the upper surface signal lines 15 and 16 of the main printed circuit board 200 and the sub printed circuit board 100 may be formed differently from each other. This is because an impedance value changes according to the dielectric layers 20 and 21 under the first conductor layer 10 in the upper surface signal lines 15 and 16 formed on the first conductor layer 10. For example, the width of the upper surface signal line 15 of the main printed circuit board 200 with the first dielectric layer 20 having a high permittivity may be formed to be narrower than the width of the upper surface signal line 16 of the sub printed circuit board 100 with the second dielectric layer 21 having a low permittivity.

In the case of the present disclosure, the permittivity of the main printed circuit board 200 is higher, and the permittivity of the sub printed circuit board 100 is lower than the permittivity of the main printed circuit board 200. When the permittivity is high, it is common that the width of the signal line is formed to be narrow in order to match the impedance with the signal line having the low permittivity.

A power stage (e.g., battery) included in the sub printed circuit board 100 may supply power to the first electronic element 41 mounted on the main printed circuit board 200 through a power supply pattern PL of the main printed circuit board 200. A predetermined voltage may be applied to the power supply pattern PL through a power stage Power.

In addition, a ground stage GND may be included in the sub printed circuit board 100.

Next, it includes a first connection block 110 to a third connection block 130 for bonding the main printed circuit board 200 and the sub printed circuit board 100, respectively. The first connection block 110 to the third connection block 130 may be mounted by surface mount technology (SMT).

For example, it may be directly mounted on conductive patterns Power, GND, 15, and 16 on the surface of the dielectric layer 20 by a deposition process and an etching process. In other words, the first connection block 110 to the third connection block 130 may be directly soldered onto the conductive patterns Power, GND, 15, and 16 of the first conductor layer 10.

In this case, each of the conductive patterns may be composed of the conductive material (e.g., metal, carbon nanotube, etc.) capable of passing electricity.

Particularly, the first connection block 110 may be soldered onto the upper surface signal line 15 on the main printed circuit board 200 and the upper surface signal line 16 on the sub printed circuit board 100 to connect the two signal lines to each other.

In addition, the second connection block 120 may be soldered onto the power stage Power of the sub printed circuit board 100 and the power supply pattern PL of the main printed circuit board 200, so that the sub printed circuit board 100 and the main printed circuit board 200 may be supplied with the same power.

In addition, the third connection block 130 may be mutually soldered to the ground stage GND of the main printed circuit board 200 to the grounding of the sub printed circuit board 100, so that the sub printed circuit board 100 and the main printed circuit board 200 may be made to have the same grounding.

A configuration of soldering directly onto the conductive patterns Power, GND, 15, and 16 by examining lower surfaces of the first connection block 110 to the third connection block 130 in detail will be described later in FIGS. 4 to 6.

First, each configuration will be described in detail through perspective views of the sub-printed circuit board 100 and the first to third connection blocks 110, 120, and 130 according to the embodiment illustrated in FIG. 3.

As illustrated in FIG. 3, the first connection block to the third connection block 110, 120, and 130 may include pins for fixing the main printed circuit board 200 and the sub printed circuit board 100, respectively.

Particularly, the first connection block 110 illustrated in FIG. 3 may include two pins 111 for bonding and fixing the main printed circuit board 200, and may include two pins 112 for bonding and fixing the sub printed circuit board 100.

Therefore, the main printed circuit board 200 may include two holes 113 for inserting the two pins 111 to fix the two pins 111, and the sub printed circuit board 100 may include two holes 104 for inserting the two pins 112 to fix the two pins 112.

Similarly, the second connection block 120 may include two pins 121 for bonding and fixing the main printed circuit board 200, and may include two pins 122 for bonding and fixing the sub printed circuit board 100.

Therefore, the main printed circuit board 200 may include two holes 123 for inserting the two pins 121 to fix the two pins 121, and the sub printed circuit board 100 may include two holes 105 for inserting the two pins 122 to fix the two pins 122.

In addition, the third connection block 130 may include two pins 131 for bonding and fixing the main printed circuit board 200, and may include two pins 132 for bonding and fixing the sub printed circuit board 100.

Therefore, the main printed circuit board 200 may include two holes 133 for inserting the two pins 131 to fix the two pins 131, and the sub printed circuit board 100 may include two holes 106 for inserting the two pins 132 to fix the two pins 132.

As illustrated in FIG. 3, some regions of the main printed circuit board 200 may be manufactured in an opening shape, and the printed circuit board assembly 1 may be manufactured by being manufactured so that the sub printed circuit board 100 fits inside a region corresponding to the area of the opening.

The manufacturing method of the printed circuit board assembly 1 of the present disclosure will be described in detail in FIGS. 10 and 11 to be described later.

However, as described above, according to the embodiment, as illustrated in FIGS. 1 and 2, it can be seen that a region (a) where the first connection block 110 is located, in which the upper surface signal line 15 of the main printed circuit board 200 and the upper surface of the sub printed circuit board 100 are bonded; a region (b) where the second connection block 120 is located, in which the power stage Power (e.g., battery) included in the sub printed circuit board 100 are bonded to supply power to the main printed circuit board 200 through the power supply pattern PL of the main printed circuit board 200; and a region (c) where the third connection block 130 is located, in which the sub printed circuit board 100 and the main printed circuit board 200 are bonded to have the same grounding, are located in different cross-sections.

However, this does not mean that the first connection block 110 to the third connection block 130 should be located in different cross-sections. Any position is possible as long as the conductive patterns of the main printed circuit board 200 and the sub printed circuit board 100 may be easily bonded together.

That is, as illustrated in FIG. 3, it is only an embodiment that the some regions of the main printed circuit board 200 may be manufactured in the opening shape so that the sub printed circuit board 100 fits in the region corresponding to the area of the opening. However, considering that the unit cost of the sub printed circuit board 100 having a low permittivity signal line is higher than the unit cost of the main printed circuit board 200, it is most preferable to form the printed circuit board assembly 1 by minimizing the area of the sub printed circuit board 100.

At this time, as in the present disclosure, as the printed circuit board assembly 1 including the sub printed circuit board 100 is formed by forming the opening, it is possible to connect printed circuit boards having different permittivity.

In addition, by minimizing the area of the sub printed circuit board 100, although high-speed communication is possible when manufacturing the printed circuit board assembly 1, the unit cost may be minimized.

In addition, as the combination of the sub printed circuit board 100 capable of high-speed communication and the commonly used main printed circuit board 200, in the case of different types of printed circuit boards, it is possible to solve a problem of an increases in inductance or an impedance mismatch compared to the case of using a connector.

Figure 4:
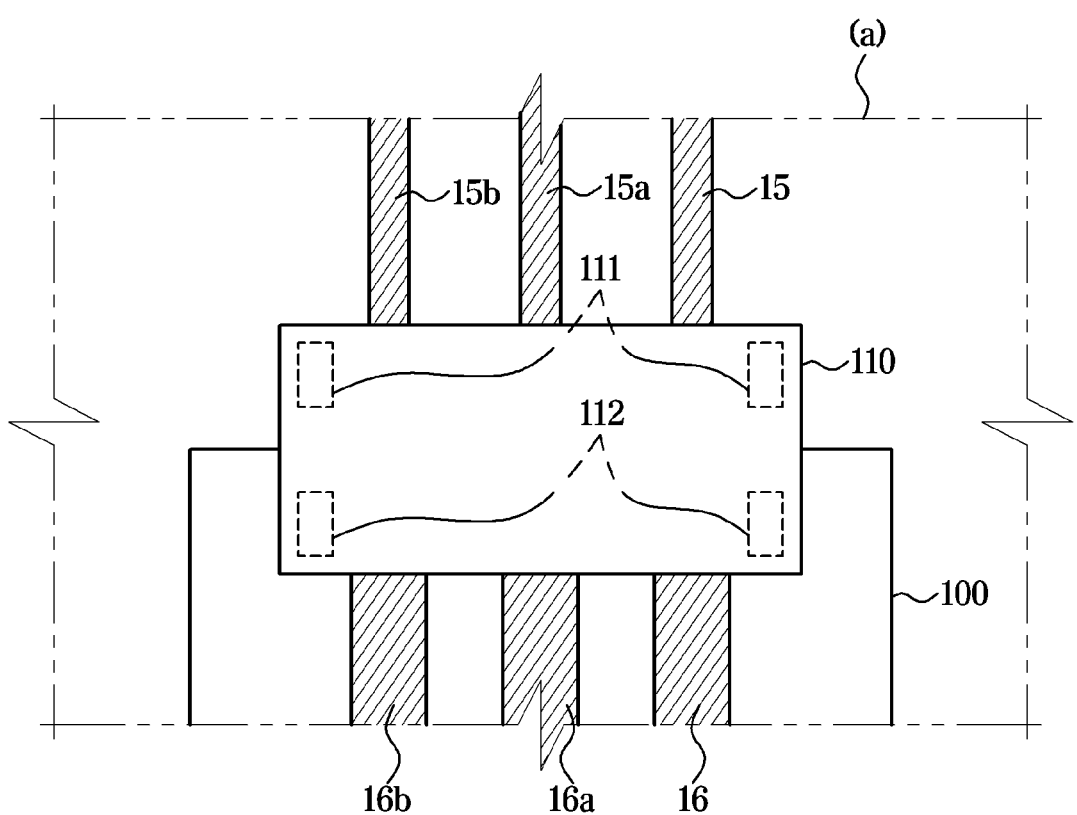
FIG. 4 is a view illustrating a plane in which a region (a) of FIG. 1 is enlarged.
Figure 5:
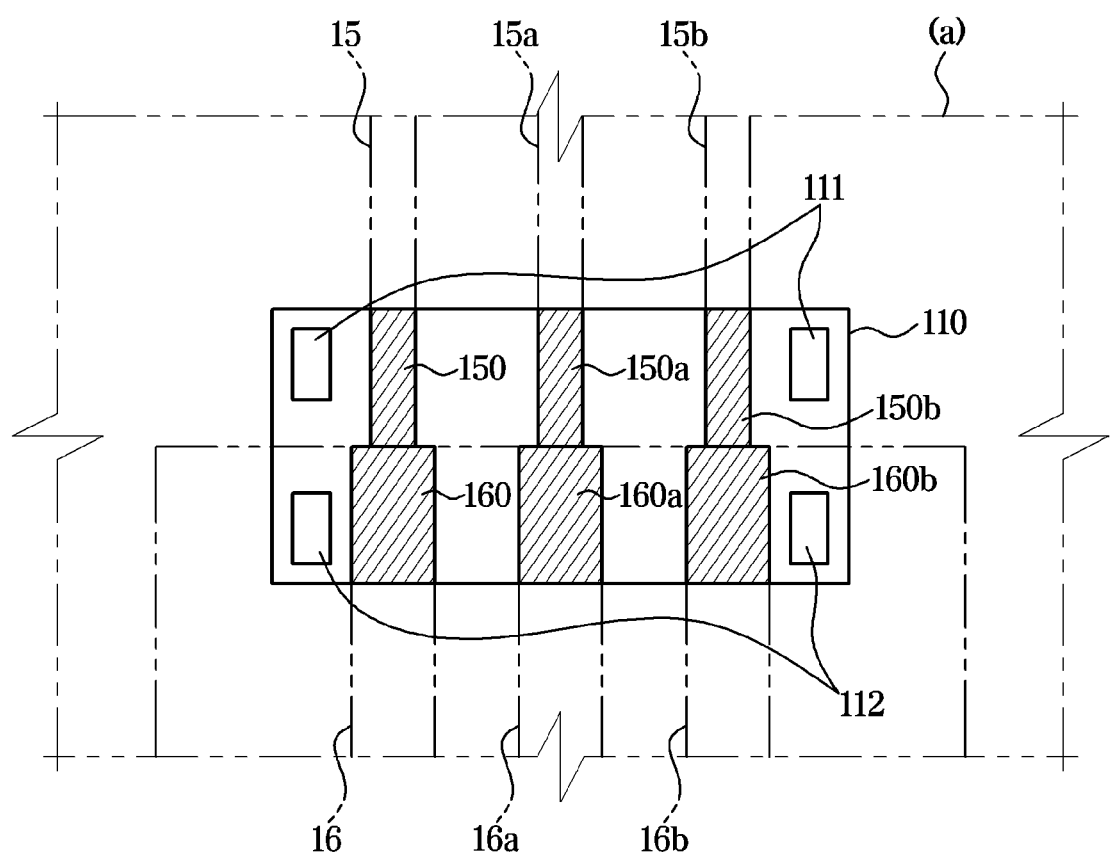
FIG. 5 is a view illustrating a bottom of a first connection block.

FIG. 4 is a view illustrating a plane in which a region (a) of FIG. 1 is enlarged. FIG. 5 is a view illustrating a bottom of a first connection block. FIG. 6 is a view illustrating a side view of a first connection block.

Particularly, the region (a) is a region where the first connection block 110 bonding the upper surface signal line 15 of the main printed circuit board 200 and the upper surface signal line 16 of the sub printed circuit board 100 is located.

The main printed circuit board 200 may further include additional upper surface signal lines 15a and 15b in addition to the upper surface signal line 15 to transmit signals to other elements included in the main printed circuit board 200. The sub printed circuit board 100 may also include additional upper surface signal lines 16a and 16b in addition to the upper surface signal line 16.

The first connection block 110 that enables the main printed circuit board 200 and the sub printed circuit board 100 to be bonded to each other in the region (a) of FIG. 4 may be fixed two pins 111 fixed to the main printed circuit board 200 and two pins 112 fixed to the sub printed circuit board 100.

Accordingly, the first connection block 110 may be disposed at a position where each upper surface signal line can be interconnected through a connection portion at a lower end of the first connection block 110.

For example, the upper surface signal line 15 of the main printed circuit board 200 may be connected to the upper surface signal line 16 of the sub printed circuit board 100 though the connection portion at the lower end of the first connection block 110. Another upper surface signal line 15a may be connected to 16a, and another upper surface signal line 15b may be connected to 16b through the connection portion at the lower end of the first connection block 110.

Hereinafter, the connection portion of the first connection block 110 in FIG. 5 will be described in detail. FIG. 5 illustrates a bottom of the first connection block 110.

Particularly, it is a connection portion 170 that can be directly soldered to the shaded portions 150, 150a, 150b, 160, 160a, and 160b to be soldered in contact with the upper surface signal lines 15,15a, and 15b of the main printed circuit board 200 and the upper surface signal lines 16,16a, and 16b of the sub printed circuit board 100.

Particularly, the connection portion 170, which is the shaded portion that is soldered in contact with the upper surface signal lines 15, 15a, 15b, 16, 16a, and 16b, is coated with a solder paste mixed with a flux and solder powder, and then the connection portion 170 may be soldered in contact with the upper surface signal lines 15, 15a, 15b, 16, 16a, and 16b by heating, and accordingly, the upper surface signal lines 15, 15a, 15b, 16, 16a, and 16b may be electrically connected to respective portions 150, 150a, 150b, 160, 160a, and 160b of the connection portion.

That is, the first region 150 and the second region 160 of the connection portion form a single connection portion 170 that is electrically connected, the first region 150 is electrically connected to the upper surface signal line 15 of the main printed circuit board 200 by soldering, and the second region 160 is electrically connected to the upper surface signal line 16 of the sub printed circuit board 100 by soldering. Accordingly, the upper surface signal line 15 of the main printed circuit board 200 and the upper surface signal line 16a of the sub printed circuit board 100 may be electrically connected through the connection portion 170.

Similarly, the third region 150a and the fourth region 160a of the connection portion form the single connection portion 170 that is electrically connected, the third region 150a is electrically connected to the upper surface signal line 15a of the main printed circuit board 200 by soldering, and the fourth region 160a is electrically connected to the upper surface signal line 16a of the sub printed circuit board 100 by soldering. Accordingly, the upper surface signal line 15a of the main printed circuit board 200 and the upper surface signal line 16a of the sub printed circuit board 100 may be electrically connected through the connection portion 170.

In addition, the fifth region 150b and the sixth region 160b of the connection portion form the single connection portion 170 that is electrically connected, the fifth region 150b is electrically connected to the upper surface signal line 15b of the main printed circuit board 200 by soldering, and the sixth region 160b is electrically connected to the upper surface signal line 16b of the sub printed circuit board 100 by soldering. Accordingly, the upper surface signal line 15b of the main printed circuit board 200 and the upper surface signal line 16b of the sub printed circuit board 100 may be electrically connected through the connection portion 170.

The connection portion 170 of the first connection block 110 is respectively soldered to a plurality of upper surface signal lines to enable electrical connection, and the number of individual soldering regions of the connection portion 170 may also vary depending on the number of the plurality of upper surface signal lines.

Figure 6:
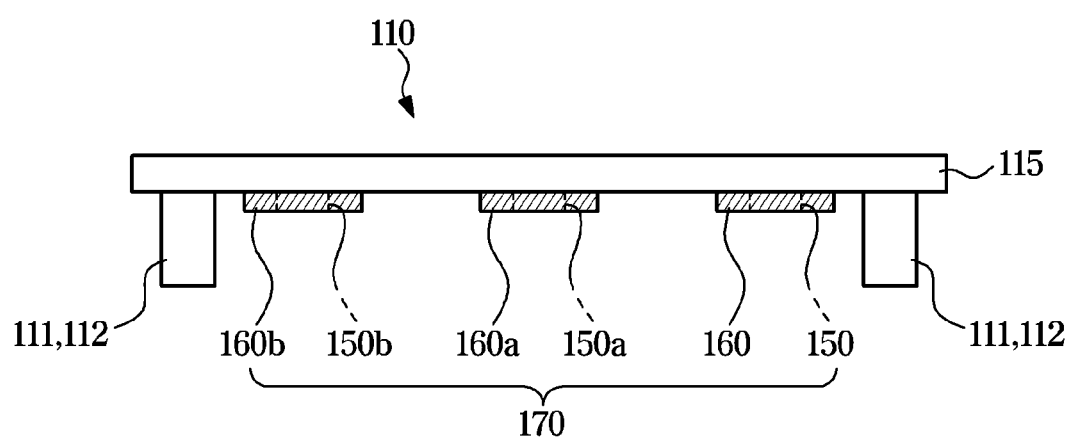
FIG. 6 is a view illustrating a side view of a first connection block.

The side of the first connection block 110 is as illustrated in FIG. 6.

A side cross-sectional view of the first connection block 110 illustrated in FIG. 6 is shown, and a cross-sectional view A-A' of FIG. 3 is illustrated.

As illustrated in FIG. 6, the first connection block 110 may include a first connection block plate 115 to which different pins 111 and 112 are fixed to be fixed to the main printed circuit board 200 or the sub printed circuit board 100, and a conductive connection portion 170 disposed on the first connection block plate 115.

That is, the pins 111 and 112 may be physically fixed by the first connection block 110 to the main printed circuit board 200 or the sub printed circuit board 100.

In addition, the first connection block 110 may be electrically fixed to the main printed circuit board 200 or the sub printed circuit board 100 through the connection portion 170 in addition to physical fixing through the pins 111 and 112.

That is, the conductive connection portion 170 may include the first region 150 to the sixth region 160b. The first region 150 and the second region 160 may be connected to each other and soldered to the main printed circuit board 200 and the sub printed circuit board 100, respectively. The third region 150a and the fourth region 160a may be connected to each other and soldered to the main printed circuit board 200 and the sub printed circuit board 100, respectively. The fifth region 150b and the sixth region 160b may be connected to each other and soldered to the main printed circuit board 200 and the sub printed circuit board 100, respectively.

Figure 7:
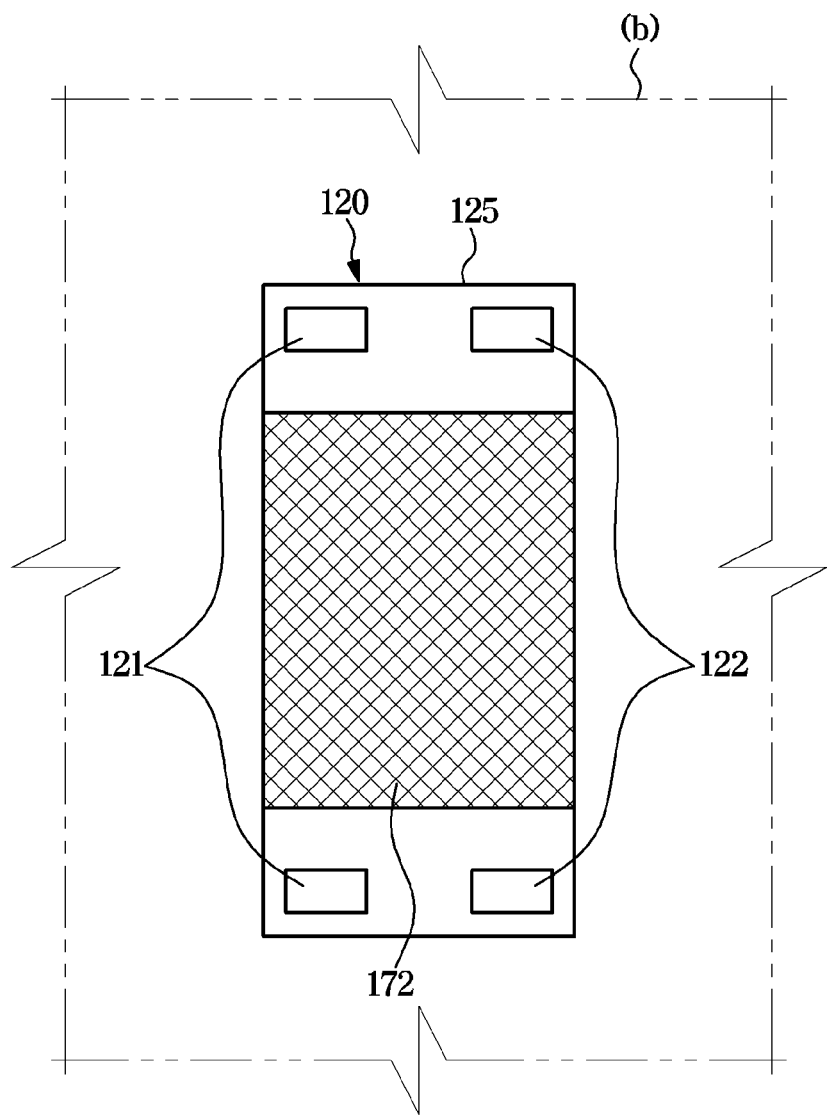
FIG. 7 is a view illustrating a bottom of a second connection block.
Figure 8:
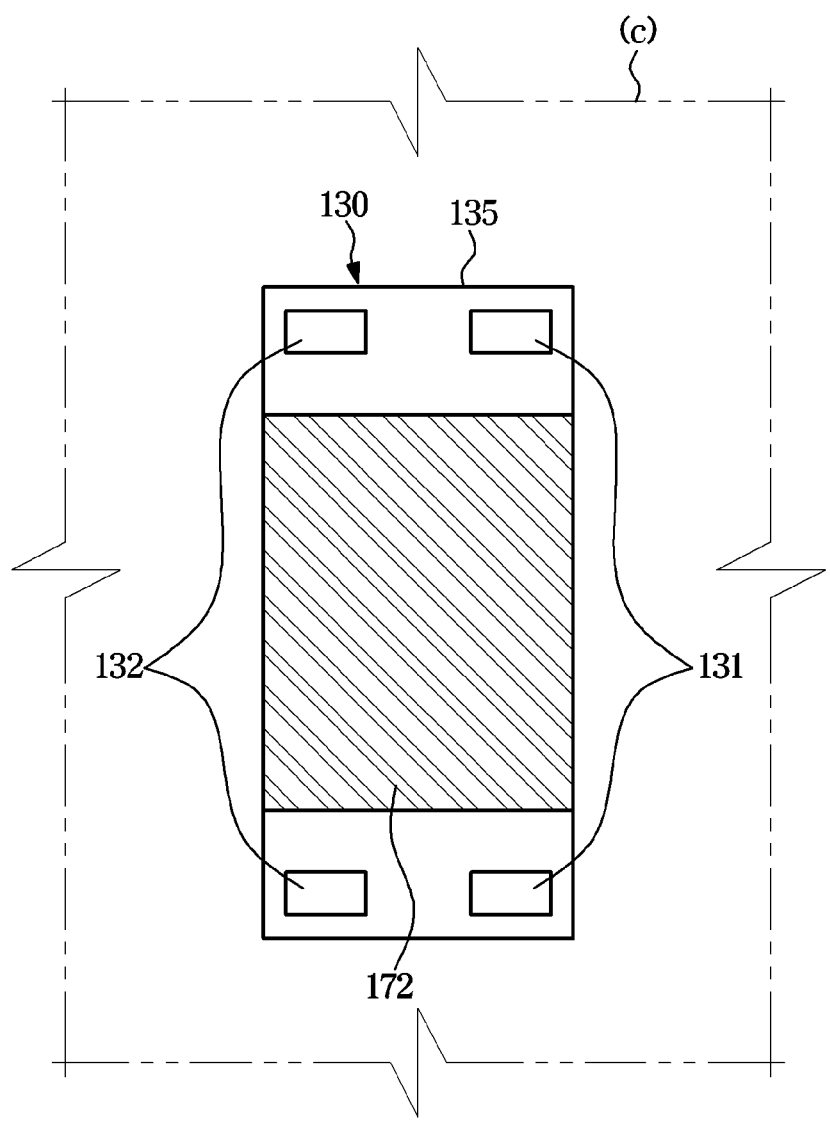
FIG. 8 is a view illustrating a bottom of a third connection block.

FIG. 7 is a view illustrating a bottom of a second connection block, and FIG. 8 a view illustrating a bottom of a third connection block.

First, as illustrated in FIG. 7, the second connection block 120 may include different pins 121 and 122 to be fixed to the main printed circuit board 200 or the sub printed circuit board 100. At this time, the pin 121 may be inserted into the holes 123 of the main printed circuit board 200, and the pin 122 may be inserted into the holes 105 of the sub printed circuit board 100 to be fixed. Accordingly, the second connection block 120 may be physically coupled to the main printed circuit board 200 and the sub printed circuit board 100.

In addition, the second connection block 120 may include a connection portion 171 soldered to a second connection block plate 125 to contact the power stage Power of the sub printed circuit board 100. Accordingly, the connection portion 171 may be able to supply the same power by electrically connecting the power stage (e.g., the battery) included in the sub printed circuit board 100 and the power supply pattern PL of the main printed circuit board 200 to each other through the connection portion 171.

Next, as illustrated in FIG. 8, the third connection block 130 may include different pins 131 and 132 to be fixed to the main printed circuit board 200 or the sub printed circuit board 100. At this time, the pin 131 may be inserted into the holes 133 of the main printed circuit board 200, and the pin 132 may be inserted into the holes 106 of the sub printed circuit board 100 to be fixed. Accordingly, the third connection block 130 may be physically coupled to the main printed circuit board 200 and the sub printed circuit board 100.

In addition, the third connection block 130 may include a connection portion 172 soldered to a third connection block plate 135 to contact the ground stage GND of the sub printed circuit board 100. Accordingly, the connection portion 172 may be connected so that the ground stage GND of the sub printed circuit board 100 and the grounding of the main printed circuit board 200 are electrically the same, so that the main printed circuit board 200 and the sub printed circuit board 100 have the same grounding.

Figure 9:
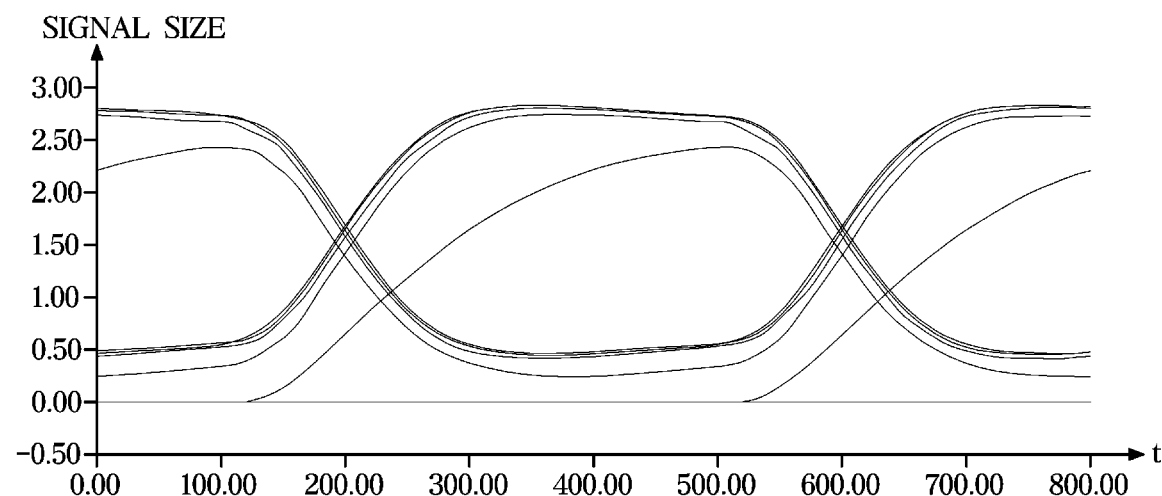
FIG. 9 is a graph illustrating a degree of signal transmission loss of dielectrics having different permittivity.
Figure 9:
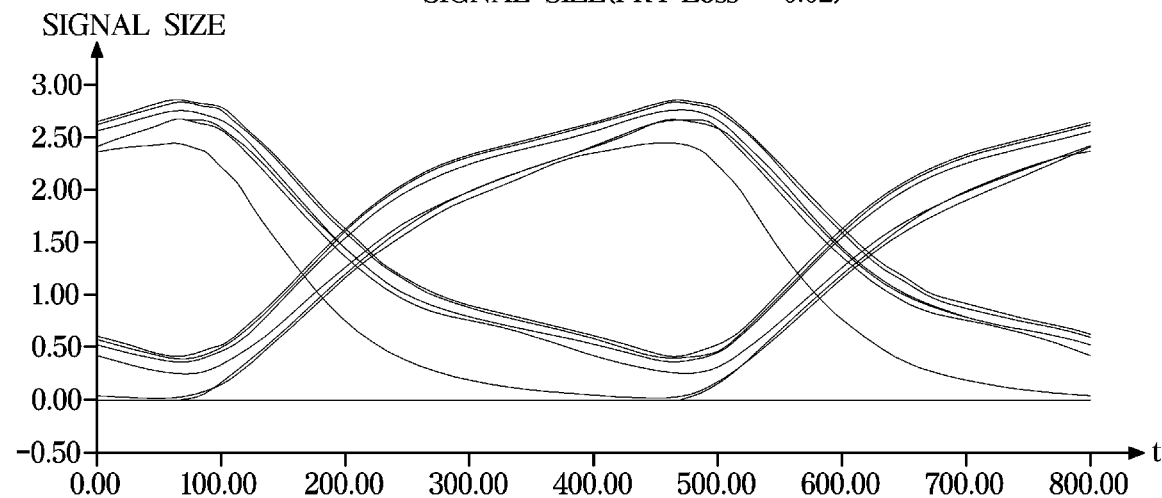

FIG. 9 is a graph illustrating a degree of signal transmission loss of dielectrics having different permittivity. As described above, it is assumed that the permittivity of the dielectric layer 21 of the sub printed circuit board 100 is smaller than that of the dielectric layer 20 of the main printed circuit board 200.

Typically, a communication digital signal draws a waveform while moving a step-by-step level over time, and the waveform that illustrates the flow of step-by-step level movement flow in a specific time unit is called an eye pattern.

However, when passing through each communication line, loss due to noise occurs, and a shape of the eye is closed rather than a clear eye pattern, which is expressed as 'deteriorated'. For example, before an initial signal is generated and noise penetrates, it can be seen that a digital overlapping waveform resembles a human eye, so it has the clear eye pattern.

That is, as illustrated in an upper graph of FIG. 9, when a commercially used Teflon printed circuit board is used, a loss value of 0.004 occurs. When passing through the communication line of the sub printed circuit board 100 using Teflon, although the permittivity is small, signal loss occurs compared to the case where the initial signal is generated, and accordingly, it can be seen that the eye has a smaller shape compared to (i).

In contrast, as illustrated in a lower graph of FIG. 9, when a commercially used FR4 printed circuit board is used, a loss value of 0.020 occurs. When passing through the communication line of the main printed circuit board 100 using FR4, since the permittivity is larger than when passing through the communication line of the sub printed circuit board 100, it can be seen that it has a very small eye shape compared to when the initial signal is generated.

Therefore, in order to enable high-speed communication while minimizing loss, it is intended to use the sub printed circuit board 100 for the some regions of the printed circuit board assembly.

Accordingly, as in the present disclosure, as the opening of the main printed circuit board 200 is formed to include the sub printed circuit board 100 to form the printed circuit board assembly 1, the connection of printed circuit boards with different permittivity may be possible.

In addition, by minimizing the region of the sub printed circuit board 100, although high-speed communication is possible when manufacturing the printed circuit board assembly 1, the unit cost may be minimized.

In addition, as the combination of the sub printed circuit board 100 capable of the high-speed communication and the commonly used main printed circuit board 200, in the case of different types of printed circuit boards, it is possible to solve a problem that occurs or an impedance mismatching problem.

In the above, each component constituting the printed circuit board assembly 1 has been described in detail.

Hereinafter, a method in which the components constituting the printed circuit board assembly 1 are combined with each other and manufactured will be described in detail.

Figure 10:
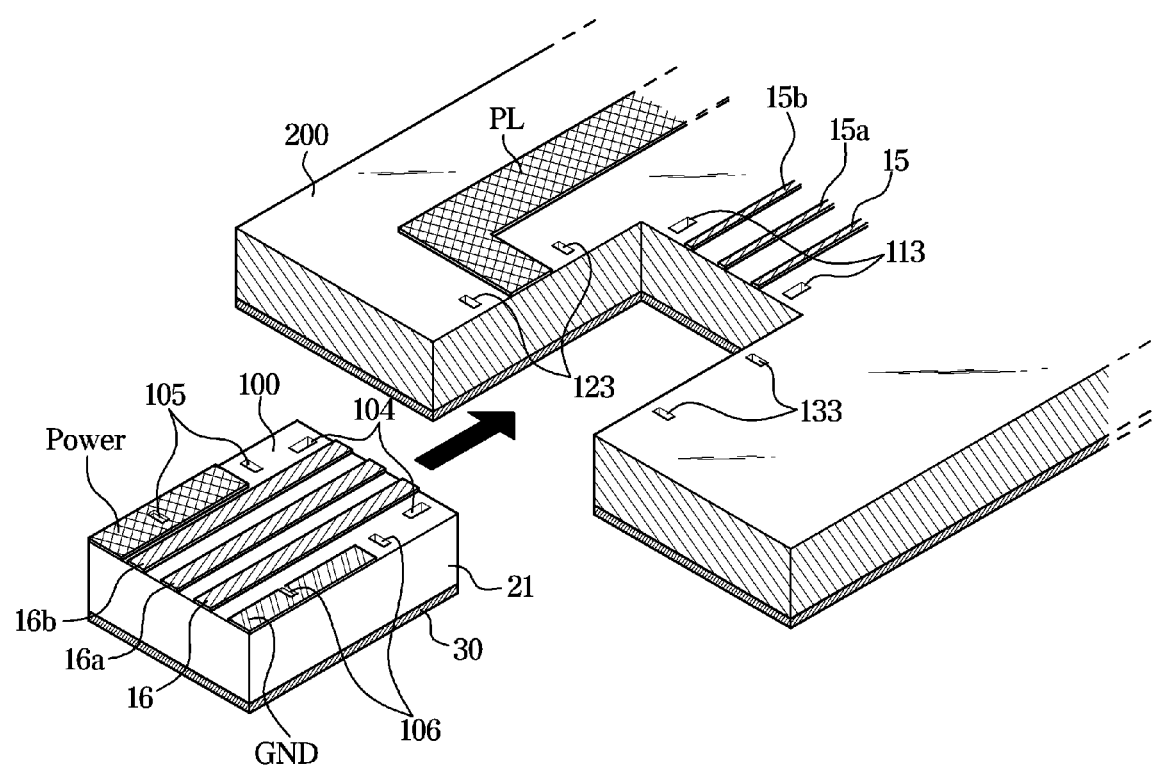
FIG. 10 is a view illustrating a method of assembling a sub printed circuit board to a main printed circuit board.
Figure 11:
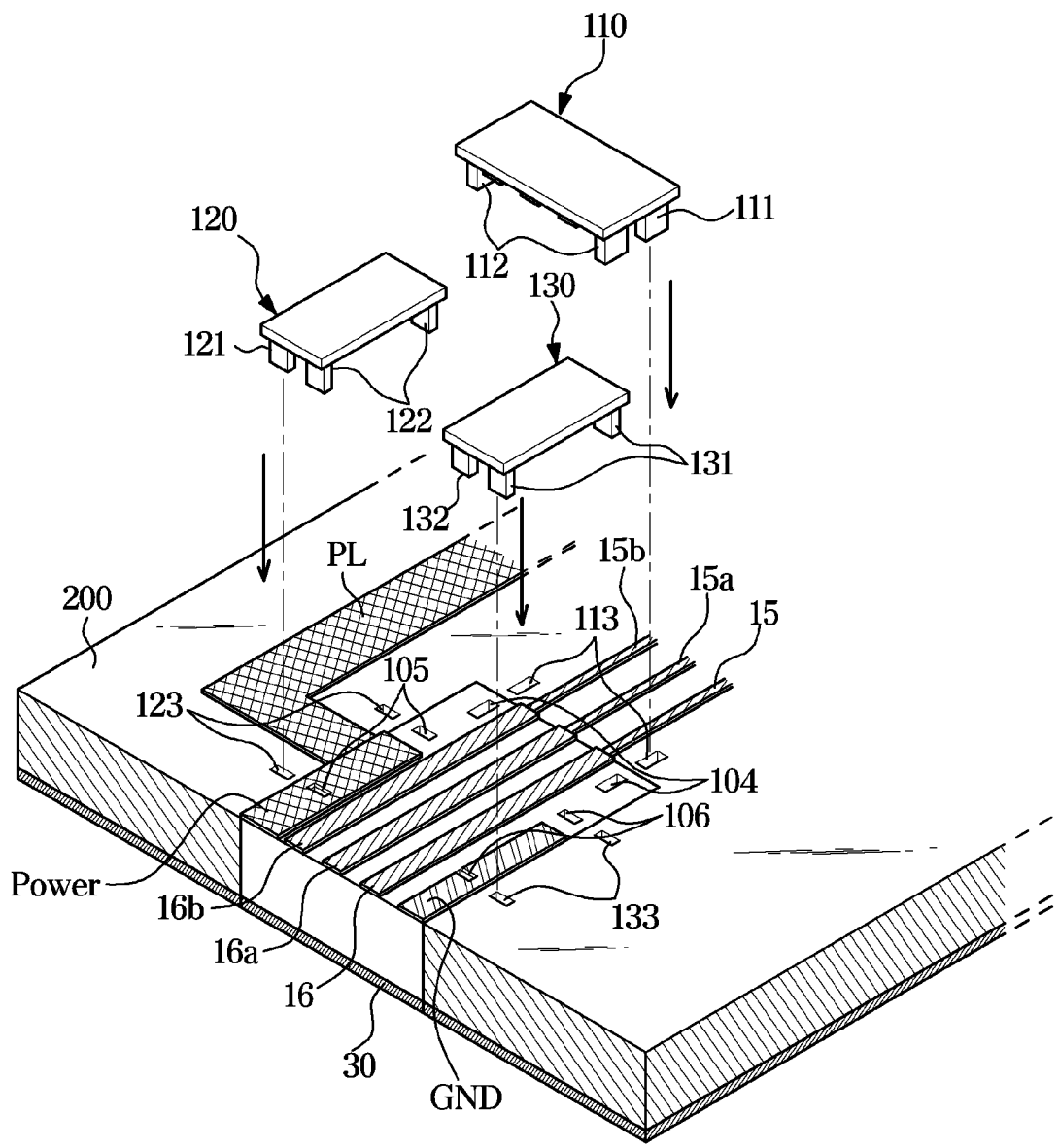
FIG. 11 is a view illustrating a method of assembling first to third connection blocks on an upper surface of a printed circuit board assembly.

Particularly, FIG. 10 is a view illustrating a method of assembling a sub printed circuit board to a main printed circuit board, and FIG. 11 is a view illustrating a method of assembling first to third connection blocks on an upper surface of a printed circuit board assembly.

First, as illustrated in FIG. 10, the sub printed circuit board 100 manufactured in a shape suitable for the opening of the main printed circuit board 200 may be assembled in the opening.

Particularly, the opening of the main printed circuit board 200 may be formed to include three different cross-sections. At this time, in a first cross-section d, the main printed circuit board 200 and the upper surface signal line of the sub printed circuit board 100 may contact each other. In a second cross-section e, the power stage Power of the main printed circuit board 200 and the sub printed circuit board 100 and the power supply pattern PL of the main printed circuit board 200 may contact each other. In a third cross-section f, and the main printed circuit board 200 and the ground stage GND of the sub printed circuit board 100 may be formed to contact each other.

At this time, the conductive patterns Power, GND, 15, and 16 of the main printed circuit board 200 and the sub printed circuit board 100 are all formed on the upper surface of the first conductor layer 10, but each of main printed circuit board 200 and the sub printed circuit board 100 may include the first conductor layer 10, the second conductor layer 30, and the dielectric layer 20 provided between the first conductor layer 10 and the second conductor layer 30.

Accordingly, the sub-printed circuit board 100 is physically inserted into the opening of the main printed circuit board 200 so that the conductive patterns of the first conductor layer 10 should be easily manufactured to contact each other.

Thereafter, FIG. 11 is a view illustrating a method of assembling the first to third connection blocks on the upper surface of the printed circuit board assembly 1.

In order to electrically connect the physically separated main printed circuit board 200 and the sub printed circuit board 100, the connection portions 170 of the first connection block 110 to the third connection block 130 may be soldered to the conductive patterns of each of the main printed circuit board 200 and the sub printed circuit board 100.

However, before the first connection block 110 to the third connection block 130 are electrically connected to the main printed circuit board 200 and the sub printed circuit board 100 through the connection portion 170, the first connection block 110 to the third connection block 130 physically fix the pins 111, 112, 121, 122, 131, and 133 to the holes 113, 123 and 133 included in the main printed circuit board 200 and the holes 104, 105 and 106 included in the sub printed circuit board 100 to couple the first connection block 110 to the third connection block 130.

The disclosed embodiments may be implemented in the form of a recording medium storing computer-executable instructions that are executable by a processor. The instructions may be stored in the form of a program code, and when executed by a processor, the instructions may generate a program module to perform operations of the disclosed embodiments. The recording medium may be implemented non-transitory as a computer-readable recording medium.

The non-transitory computer-readable recording medium may include all kinds of recording media storing commands that can be interpreted by a computer. For example, the non-transitory computer-readable recording medium may be, for example, ROM, RAM, a magnetic tape, a magnetic disc, flash memory, an optical data storage device, etc.

Embodiments of the disclosure have thus far been described with reference to the accompanying drawings. It should be obvious to a person of ordinary skill in the art that the disclosure may be practiced in other forms than the embodiments as described above without changing the technical idea or essential features of the disclosure. The above embodiments are only by way of example, and should not be interpreted in a limited sense.

The invention claimed is:

1. A printed circuit board assembly comprising:
   a main printed circuit board including a first main signal line and a first dielectric having a first permittivity;
   a sub printed circuit board including a first sub signal line and a second dielectric having a second permittivity smaller than the first permittivity; and
   a first connection block configured to connect the first main signal line of the main printed circuit board and the first sub signal line of the sub printed circuit board,
   wherein the main printed circuit board further comprises a main power line and a main ground line,
   wherein the sub printed circuit board further comprises a sub power line and a sub ground line, and
   wherein the printed circuit board assembly further comprises:
      a second connection block configured to connect the main power line and the sub power line; and
      a third connection block configured to connect the main ground line and the sub ground line.

2. The printed circuit board assembly according to claim 1, wherein the first connection block further comprises a first connection portion configured to electrically connect the first main signal line and the first sub signal line.

3. The printed circuit board assembly according to claim 1, wherein:
   the second connection block further comprises a second connection portion configured to electrically connect the main power line and the sub power line; and
   the third connection block further comprises a third connection portion configured to electrically connect the main ground line and the sub ground line.

4. The printed circuit board assembly according to claim 3, wherein the first connection block, the second connection block, and the third connection block comprise a printed circuit board.

5. The printed circuit board assembly according to claim 4, wherein the first connection block, the second connection block, and the third connection block are mounted on surfaces of the main printed circuit board and the sub printed circuit board by surface mount technology (SMT).

6. The printed circuit board assembly according to claim 1, wherein a communication speed of the first sub signal line is faster than a communication speed of the first main signal line.

7. The printed circuit board assembly according to claim 1, wherein:
   the first connection block comprises at least one pin fixed to the main printed circuit board and at least one pin fixed to the sub printed circuit board;
   the main printed circuit board comprises at least one groove to which the at least one pin of the first connection block is fixed; and
   the sub printed circuit board comprises at least one groove to which the at least one pin of the first connection block is fixed.

8. The printed circuit board assembly according to claim 7, wherein the at least one pin of the first connection block is physically fixed and coupled to the at least one groove of the main printed circuit board and the at least one groove of the sub printed circuit board, respectively.

9. A printed circuit board assembly comprising:
   a main printed circuit board having a first main signal line and a first communication speed;
   a sub printed circuit board having a first sub signal line and a second communication speed faster than the first communication speed; and
   a first connection block configured to connect the first main signal line of the main printed circuit board and the first sub signal line of the sub printed circuit board,
   wherein the main printed circuit board further comprises a main power line and a main ground line,
   wherein the sub printed circuit board further comprises a sub power line and a sub ground line, and
   wherein the printed circuit board assembly further comprises:
      a second connection block configured to connect the main power line and the sub power line; and
      a third connection block configured to connect the main ground line and the sub ground line.

10. The printed circuit board assembly according to claim 9, wherein the first connection block further comprises a first connection portion configured to electrically connect the first main signal line and the first sub signal line.

11. The printed circuit board assembly according to claim 9, wherein:
   the second connection block further comprises a second connection portion configured to electrically connect the main power line and the sub power line; and
   the third connection block further comprises a third connection portion configured to electrically connect the main ground line and the sub ground line.

12. The printed circuit board assembly according to claim 11, wherein the first connection block, the second connection block, and the third connection block comprise a printed circuit board.

13. The printed circuit board assembly according to claim 12, wherein the first connection block, the second connection block, and the third connection block are mounted on surfaces of the main printed circuit board and the sub printed circuit board by surface mount technology (SMT).

14. The printed circuit board assembly according to claim 9, wherein
   the main printed circuit board further comprises a first dielectric having a first dielectric constant; and
   the sub printed circuit board further comprises a second dielectric having a second dielectric constant lower than the first dielectric constant.

15. The printed circuit board assembly according to claim 9, wherein:
   the first connection block comprises at least one pin fixed to the main printed circuit board and at least one pin fixed to the sub printed circuit board;
   the main printed circuit board comprises at least one groove to which the at least one pin of the first connection block is fixed; and the sub printed circuit board comprises at least one groove to which the at least one pin of the first connection block is fixed.

16. The printed circuit board assembly according to claim 15, wherein the at least one pin of the first connection block is physically fixed and coupled to the at least one groove of the main printed circuit board and the at least one groove of the sub printed circuit board, respectively.

* * * * *